(12) United States Patent
Bond et al.

(10) Patent No.: US 8,471,345 B2
(45) Date of Patent: Jun. 25, 2013

(54) BIOMETRIC SENSOR ASSEMBLY WITH INTEGRATED VISUAL INDICATOR

(75) Inventors: Robert Henry Bond, Plano, TX (US); Alan Kramer, Berkeley, CA (US); Giovanni Gozzini, Berkeley, CA (US)

(73) Assignee: Authentec, Inc., Melbourne, FL (US)

( * ) Notice: Subject to any disclaimer, the term of this patent is extended or adjusted under 35 U.S.C. 154(b) by 539 days.

(21) Appl. No.: 12/718,892

(22) Filed: Mar. 5, 2010

(65) Prior Publication Data
US 2011/0215341 A1 Sep. 8, 2011

(51) Int. Cl.
*H01L 27/14* (2006.01)
*H01L 23/28* (2006.01)
*H01L 21/00* (2006.01)
*G06K 9/00* (2006.01)

(52) U.S. Cl.
USPC .......... 257/414; 257/787; 257/E23.129; 257/E21.502; 438/127; 382/126

(58) Field of Classification Search
USPC ............. 257/414, E23.129; 382/126
See application file for complete search history.

(56) References Cited

U.S. PATENT DOCUMENTS

| | | | |
|---|---|---|---|
| 5,844,287 A | 12/1998 | Hassan et al. | |
| 5,864,296 A | 1/1999 | Upton | |
| 5,942,761 A | 8/1999 | Tuli | |
| 6,097,035 A | 8/2000 | Belongie et al. | |
| 6,980,286 B1 | 12/2005 | Feng | |
| 7,147,153 B2 | 12/2006 | Rowe et al. | |
| 2003/0204290 A1* | 10/2003 | Sadler et al. | 701/1 |
| 2004/0099065 A1* | 5/2004 | Deconde et al. | 73/862.046 |
| 2004/0155752 A1* | 8/2004 | Radke | 340/5.53 |
| 2008/0150050 A1* | 6/2008 | Chou et al. | 257/415 |

OTHER PUBLICATIONS

Rowe, Robert K., "A Multispectral Sensor for Fingerprint Spoof Detection", Sensors, vol. 22, No. 1, (Jan. 2005), pp. 2-4.
http://www.validityinc.com/post.aspx?id=147, "Validity Launches the First Customizable LED Fingerprint Sensor", Jan. 8, 2009.
www.boschman.nl/technology/technology.htm.

\* cited by examiner

*Primary Examiner* — Daniel Luke
(74) *Attorney, Agent, or Firm* — Allen, Dyer, Doppelt, Milbrath & Gilchrist, P.A.

(57) ABSTRACT

A biometric sensor assembly comprises a substrate to which is mounted a die containing sensor circuitry, at least one conductive bezel having a visual indicator region formed therein, and electrically connected to said die by way of said substrate, a light source, and a light-directing region directing light from the light source to the visual indicator region. The die, the light-directing region, and the bezel are encased in an encapsulation structure such that a portion of a surface of the die and the visual indication region are exposed or at most thinly covered by the encapsulation structure. The light-directing region directs light emitted by the light source within the encapsulation structure to the visual indicator region. Desired indicia in the visual indicator region may thereby be illuminated, while the die and bezel, and optionally the light source, are protected by the encapsulation structure.

36 Claims, 9 Drawing Sheets

BIOMETRIC SENSOR ASSEMBLY WITH INTEGRATED VISUAL INDICATOR

CROSS-REFERENCE TO RELATED APPLICATIONS

The present disclosure is related to and incorporates by reference application for U.S. letters patent Ser. No. 12,718,880, titled "Integrally Molded Die and Bezel Structure for Fingerprint Sensors and the Like".

BACKGROUND

The present disclosure relates to biometric sensor devices, and more specifically to a biometric sensor such as a fingerprint sensor which includes an integrated visual indicator.

One relatively common biometric sensing device today is the fingerprint sensor. These devices are used in controlling access to electronic devices such as computers and mobile phones, safes, buildings, vehicles, etc. by scanning a user's fingerprint and comparing it to an authenticating set of fingerprint images. If the proffered (live) fingerprint to be authenticated matches one within a set of pre-enrolled authorized fingerprints, access may be granted. Fingerprint sensors may be stand-alone devices such as PC peripherals, or may be integrated into the devices over which they control access.

There are various motivations to provide a visual indicator in association with a fingerprint sensor. A first set of motivations are operational. For example, cues may be provided to a user as to where to place a finger, when to slide a finger over a scanner, whether a scan was successful, etc. A second set of motivations are brand-related. For example, brand identification may be provided to a user, for example to assure the user that the sensor is an authentic product from a desired manufacturer, that the device in which the sensor resides is an authentic device from a desired manufacturer, to establish and build brand recognition among the user community as to the sensor or device in which the sensor is installed, etc. Still another set of motivations relate to providing visual interest to a device containing the sensor. To some, a colorful, illuminated device is simply more attractive and desirable than the alternative without illumination.

Today, visual indication associated with a fingerprint sensor is generally accomplished by disposing the sensor device in a separate housing that has a transparent or translucent indicator region or regions, and providing a light source such that at least a portion of the light produced shines through the transparent or translucent region. The transparent or translucent region may be a simple light "bar" or light "spot" or may be patterned to indicate a company name, design pattern of interest, and so forth.

The current methods of providing visual indication associated with a fingerprint sensor are relatively large. However, many of the most common devices into which fingerprint sensors are often installed, such as laptop computers, mobile telephones, personal digital assistant devices, etc. are often very compact, or require compact subassemblies (e.g., compact sensor devices). That is, there is pressure to reduce the size of the fingerprint sensor assembly. As current visual indication devices employ separate housings, light sources, sensor circuitry, and related connections, it is difficult if not impossible to significantly reduce the size of such assemblies.

Many current fingerprint sensors also include conductive bezels for driving a current into the finger being sensed. Examples of circuits employing bezels for this purpose are disclosed in U.S. Pat. No. 6,636,053 and U.S. Pat. No. 6,512,381, each of which being incorporated herein by reference. These bezels, which are often coplanar with the sensor surface, add to the overall size of the device. According to certain known designs, bezels are patterned with visual indicia, and a light source is provided for illuminating the pattern. The light source and bezel form a housing, and a molded fingerprint sensor is installed into such housing to obtain a fingerprint sensor and lighted bezel assembly. However, the separate bezel and light source housing are relatively large, and again, such an assembly can often result in an undesirably large final device. Furthermore, it is desired that the bezel be as physically close to the sensors as possible to optimize the sensitivity of the sensor. However, known separate illuminated bezel designs limit possible options of the sensor-to-bezel spacing.

Current visual indication devices also require a number of discrete assembly steps. As the number of discrete elements and manufacturing steps increase, manufacturing cost increases and the potential for faulty or inaccurate assembly that negatively affects product consistency, and yield losses increase. Discrete element sub-assembly is also a more time consuming process than integrated manufacturing. Thus, there is a need in the art for an improved design of a fingerprint sensor assembly which includes an integrated lighted indicator region.

SUMMARY

According to one aspect of the present disclosure, a biometric sensor assembly, or equivalently, device, such as a fingerprint sensor, comprises a substrate to which is mounted a die containing sensor circuitry, at least one conductive bezel having a visual indicator region formed therein and electrically connected to said die via said substrate, a light source, and a light-directing region which preferentially directs light from the light source to the visual indicator region. The die, the light-directing region, and the bezel are encased in a unitary encapsulation structure to protect those elements from mechanical, electrical, and environmental damage, yet with a portion of a surface of the die and the visual indication region exposed or at most thinly covered by the encapsulation or other coating material structure for operation as otherwise known in the art.

Opaque molding material forming the encapsulation structure is accommodated by the light-directing region, which is disposed so that light may pass therethrough (and hence through a region of the encapsulation structure) to illuminate the indicator region. By encasing the bezel and the light-directing region in the encapsulation structure, the bezel, the light source, and ultimately the visual indicator region may be brought closer to the sensor die than heretofore possible. In addition, the encapsulation structure protects the bezel and light-directing region in a fashion not possible by currently known lighted-bezel device designs.

According to another aspect of the disclosure, a light-directing optical element is disposed in the light-directing region between the light source and the visual indicator region. The light directing optical element may be a series of optical lenses, fiber optic elements, light pipes, molded optically conductive (e.g., transparent) compound, or similar elements. The light directing optical element receives the light output from the light source, optionally expands the light path in one or more directions, and provides the light to the back side of the visual indicator region. A much greater percentage of the light emitted by the light source is transmitted to, and hence through, the visual indicator region as compared to prior art devices, meaning that a brighter display therethrough is possible and/or a lower power light source need be used to achieve the same level of illumination.

According to another aspect of the present disclosure, the light source is physically and electrically mounted to the substrate, by solder, wirebond or other well-known interconnection technique. It may be mounted on the same (front) side of the substrate as the die, or on the opposite (back) side of the substrate as the die. In the latter case, an optical via is provided in the substrate allowing the light from the light source to travel from the back of the substrate to the front and hence to the light-directing region and ultimately to the visual indicator region. Alternatively, the substrate or even the die itself may be formed to include one or more light emitting devices, and the light-directing and visual indicator regions aligned to receive light emitted thereby. This mounting permits an automated assembly process as well as provides a much more compact final device as compared with prior art devices.

In an alternate aspect, the bezel has a void formed therein. For example, the bezel may be comprised of four sidewalls and a top surface in which the visual indicator region is formed. The four sidewalls and top surface define the void. The light-directing region may be within the void, which may also contain the optical element. In fact, the light source may be located within the void, and the bezel, light-directing region (optionally with the optical element), and light source can be installed as a single unit on the substrate, dramatically simplifying the assembly process.

In a still further aspect of the present disclosure, the light-directing optical element is formed on an underside of the bezel. The light-directing optical element may be a molded material which is capable of internally directing light provided at an input portion thereof to an output portion thereof. The light-directing optical element may be directly molded onto the underside of the bezel, prior to securing the bezel to the substrate. Alternatively, the light-directing optical element may be formed of discrete pre-formed parts which are secured to the underside of the bezel, for example by way of an optically transparent adhesive. The light-directing optical element may expand and direct the light path to fill the back side of the indicator region of the bezel. The bezel and light-directing optical element may form a single component for the assembly process, self-aligning these parts and simplifying assembly and improving device yield.

In yet another aspect of the present disclosure, the bezel is a conductive, patterned opaque or translucent metal, plastic or similar material, with the patterning forming the visual indicator region (i.e., a region which is transparent or more translucent that the non-patterned region). Alternatively, the entire bezel may be a translucent or transparent conductive material, with the entire exposed portion thereof forming the indicator region.

In any of the above aspects, there may be one or more bezels provided. For example, there may be two bezels, one located on each side of the die, such that as a user slides a finger over the die the finger slides over the first bezel, then the die, then the second bezel. The bezels may be discrete elements, or may be part of an integral bezel frame which includes the two bezels and connection pads for both physically connecting the bezel frame to the substrate and for electrically connecting the bezels to the die via the substrate, for example by way of traces pre-patterned onto the surface of the substrate. Each bezel may have its own visual indicator region, the regions of each being the same or different. Each bezel may also have associated with it its own light-directing region, optical element, and light source.

According to yet another aspect of the present disclosure, the light source is a solid state device such as a light emitting diode or laser, located integrally in the substrate. Vertical or surface emitting devices are well suited for this aspect of the disclosure. By positioning the bezel with the input portion of the optical element over the light source output, a simple, easily aligned, high brightness visual indicator with lower power requirements may be obtained. Alternatively, the light source may formed integrally within the die. An edge emitting device may then be employed, and an appropriate optical used to direct the light emitted to the visual indicator region.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings:

FIG. 7A is a top, or plan view.

DETAILED DESCRIPTION

We initially point out that descriptions of well known starting materials, processing techniques, components, equipment and other well known details are merely summarized or are omitted so as not to unnecessarily obscure the details of the present invention. Thus, where details are otherwise well known, we leave it to the application of the present invention to suggest or dictate choices relating to those details.

Figure 1:
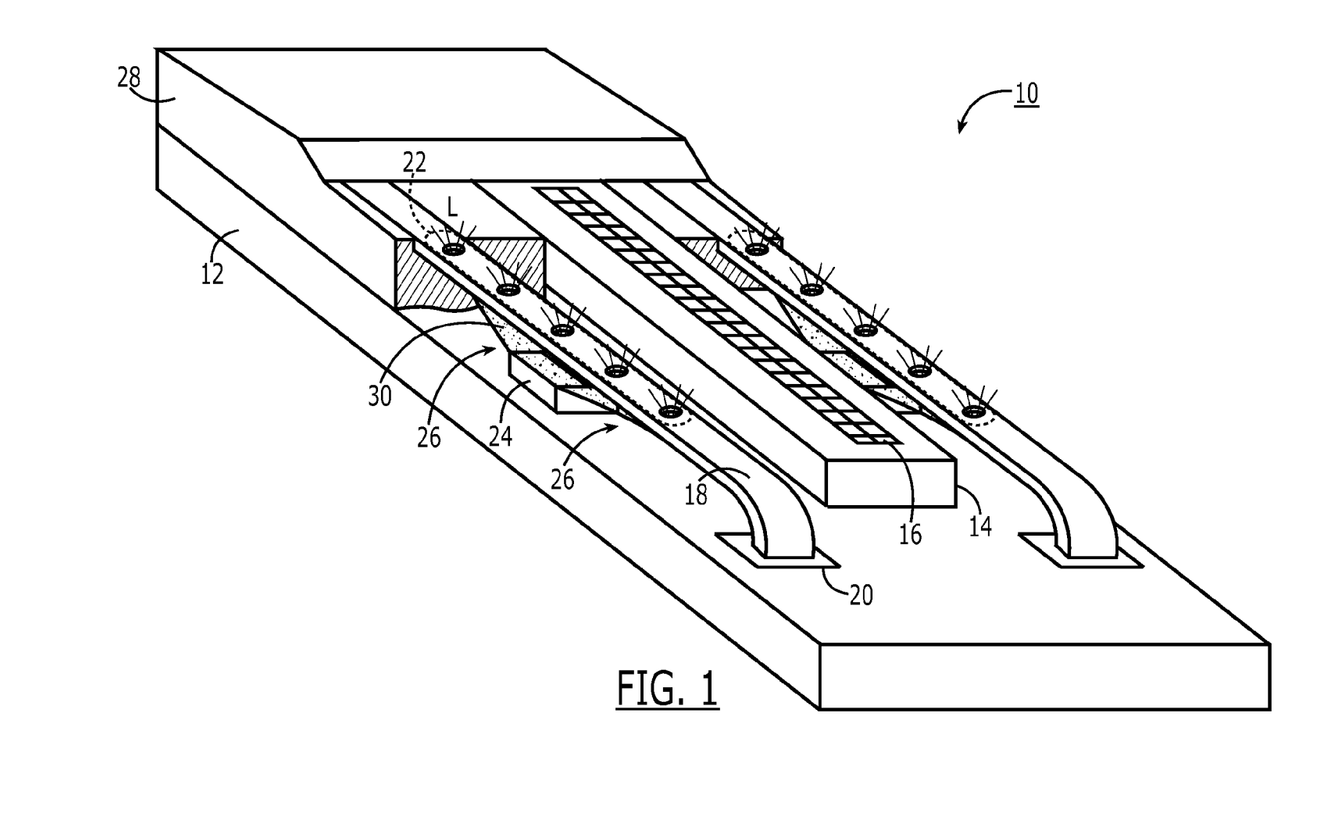
FIG. 1 is a partial cut-away perspective view of a biometric sensor assembly with integrated visual indicator according to a first embodiment of the present disclosure.

With reference first to FIG. 1, there is shown therein a partial cut-away perspective view of a biometric sensor assembly 10 with integrated visual indicator according to a first embodiment. We begin with this embodiment as illustrative of a number of the unique features of the biometric sensor with integrated visual indicator disclosed herein. Assembly 10 comprises a substrate 12, which may be a printed circuit board (PCB), ceramic body, or similar structure having formed thereon, and possibly in layers thereof, interconnection leads (not shown). Secured to substrate 12 in a die-receiving region is die 14. Die 14 is typically a semiconductor body have one or more layers formed thereon, including electrical devices such as transistors, capacitors, interconnections and the like formed photolithographically or by other semiconductor manufacturing processes. Specifically, die 14 has formed thereon a two-dimensional array 16 of sensor pixels and sensing circuitry. Die 14 may be physically connected to substrate 12 by an adhesive between the bottom side of die 14 and the top side of substrate 12, and electrically connected by a plurality of wirebonds from the top side of die 14 to the top side of substrate 12. Other methods may also be employed as well known in the art.

One or more bezels 18 are secured to bezel receiving regions 20 on substrate 12. Bezels 18 may be discrete individual elements, or may form part of a bezel frame. Bezels 18 may be opaque, conductive elements used, for example, to inject current into the finger of a user as the finger is being sensed by the pixels of two-dimensional array 16. In the embodiment shown in FIG. 1, bezels 18 are discrete inverted "U"-shaped metal structures, which may be individually secured to bezel receiving regions 20. It should be noted that FIG. 1 is a partial cut-away of a completed structure and that each bezel in this embodiment has at least one, and typically two points of contact with substrate 12. Thus, one such point of contact is shown in the cut-away portion, while the other is within the portion of encapsulation structure 28 shown in the FIG. 1 and thus not shown.

Bezel 18 is provided with a visual indicator region 22. Light from a light source 24 (discussed further below) may shine through visual indicator region 22, providing various forms of indicia to a user, such as cues as to where to place a finger, when to slide a finger over a scanner, whether a scan was successful, the manufacturer of the fingerprint sensor or device into which the fingerprint sensor is disposed, desired text or symbols, or simply provide light, colors and/or patterns for visual interest or feedback. The indicia are shown in FIG. 1 as a series of dots, but the indicia may be virtually any pattern, image, text or the like. Etched, milled or laser drilled recesses or holes in the top surface of bezel 18 may form the indicia provided in visual indicator region 22. Alternatively, the indicia may be formed by etched, milled or laser drilled recess or holes in the back surface of bezel 18.

In the event that the indicia in region 22 are formed in the top surface of bezel 18, the recesses or holes may be filled by optically transmissive material to prevent a build up of dirt, oil, and other contaminants, or simply may be left open. In the event that the indicia are formed not by through-holes, but by thinned regions of bezel 18, the regions should be sufficiently thin so as to appear preferentially illuminated as compared to the remainder of bezel 18. In either case, high transmissivity is desired in order to reduce the required brightness of the light source and power required to drive that source.

In one embodiment, assembly 10 is further provided with one more light sources 24, which may be secured and/or electrically connected to substrate 12 and positioned such that light emitted thereby may be directed to visual indicator region(s) 22. Light source 24 will typically be a solid state device such as a light emitting diode (LED), vertical cavity surface emitting laser (VCSEL), inorganic (crystalline)-based semiconductor LED (OLED) or the like. The scope of the present invention is not intended to be limited by the structure nor mode of operation of light source 24. Light source 24 may be mounted within a housing and optionally may have a dispersion lens integrally located in the housing. Alternatively, light source 24 may have no housing or lens, but instead be part of a light source die (such as silicon) mounted directly to the substrate and electrically connected to the substrate for example by wirebonding. Light source 24 (or the material encasing same) may produce light in one of a variety of colors, or multiple colors, or may optionally include a phosphor diffuser for white light emission. Light source 24 (or the material encasing same) may emit light in a specific direction, such as generally perpendicular to the plane of the surface of substrate 12 when mounted thereto.

As shown in FIG. 1, light source 24 is a discrete element secured to the surface of substrate 12. Electrical interconnections on substrate 12 connect light source 24 to die 14. Alternatively, interconnections connect light source 24 to connection pads for connecting to external drive circuitry (not shown) to enable operation of light source 24. Light source 24 is shown in FIG. 1 as being located on the top side of substrate 12 (defined as the side to which die 14 is mounted). However, in other embodiments, light source 24 may be located on the back side of substrate 12 or may be integrally located therein or in die 14, as discussed further below.

A light-directing region 26 is provided in the optical path between light source 24 and visual indicator region 22 to reduce loss of light energy in the propagation from light source 24 to and through visual indicator region 22. In this way, light emitted from light source 24 is emitted through visual indicator region 22 as light L, visible to a user.

Light-directing region 26 may be a bounded hollow region or may contain one or more optical elements. Shown in FIG. 1 is one such optical element, a molded optically conductive compound 30. Compound 30 may be an injection molded element formed on or subsequently attached to bezel 18. In one embodiment, compound 30 is initially molded onto bezel 18, then the combined bezel and compound 18/30 is mounted to substrate 12. Compound 30 may be PC (polycarbonate), polyethelene, poly-methyl-methacrylate PMMA or similar materials that can withstand the relatively high temperature of a solder reflow processes (~260° C.) which is part of the device assembly process.

Figure 2A:
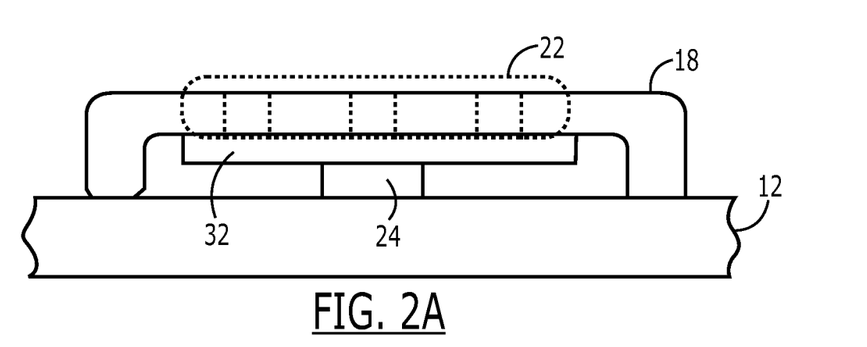
FIGS. 2A and 2B are side, or elevation, views of several alternate examples of optical elements disposed with the biometric sensor assembly with integrated visual indicator according to the present disclosure.
Figure 2B:
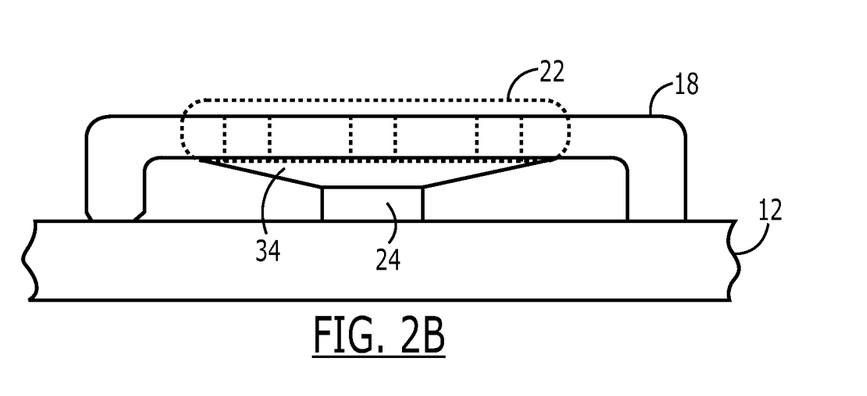

With reference to FIGS. 2A and B, there is shown therein several alternate examples of such optical elements. FIG. 2A shows a lens 32, which may be secured to the underside of bezel 18, the top of light source 24, or both, by an optically transmissive adhesive, for preferentially directing light from light source 24 to visual indicator region 22. FIG. 2B shows a fiber optic light guide or light pipe 34, which again may be preformed onto bezel 18 or alternatively may be secured to the underside of bezel 18, the top of light source 24, or both, by an optically transmissive adhesive, for preferentially directing light from light source 24 to visual indicator region 22. Other light directing elements may be employed, or combinations of such elements, as the specific application of the present disclosure should warrant, and such other elements are considered within the scope of this disclosure and claims appended hereto.

Returning to FIG. 1, die 14, bezel 18, and light source 24 are embedded within an encapsulation structure 28 such that a top surface of die 14, and in particular array 16, as well as a top surface of bezel 18, and in particular indicator region 22, are visibly exposed to a user. These top surfaces are either coplanar or are in closely spaced apart, parallel planes. These exposed regions may be uncovered by the encapsulation structure 28. One or both of the top surface of array 16 and bezel 18 may alternatively be very thinly covered by encapsulation structure material or other coating materials in order to provide physical protection of the array, but such that capacitive sensing of the fingerprint pattern and/or conduction between bezel 18 and the user's finger is nevertheless enabled.

The material forming encapsulation structure 28 may be an insulative, semi-transparent or opaque resin or plastic of a type otherwise well known in the art. The encapsulation may be accomplished by transfer molding or other techniques. One of a variety of integrated circuit molding techniques known in the art may be employed to form encapsulation structure 28. According to one example of these techniques, disclosed in U.S. Pat. No. 6,686,227, which is incorporated herein by reference, the die is mounted to the substrate, with bonding wires making electrical connection between the die and substrate. The die and substrate are placed in a mold body, such that the mold body clamps the substrate to hold the assembly in place. Encapsulation material is injected into the mold body. A seal blocks any introduced encapsulation material injected into the mold from being applied to the region of the surface which is desirably to be exposed, in the present case the upper surfaces of die 14 and bezel 18. By including bezel 18, light sources 24, and light-directing regions 26 within the mold body in the molding process, and positioning the upper surfaces of bezel 18 generally co-planar with the upper surface of die 14, the molding process may effectively encapsulate die 14, bezel 18, light sources 24, and light directing regions 26 within encapsulation structure 28 yet provide the desired exposed surface regions of die 14 and bezel 18.

Encapsulation structure 28 will substantially cover the top surface of substrate 12. It may also extend to the sides of substrate 12. The back side of substrate 12 may be provided with conductive bump contacts (e.g., ball grid array or land grid array, not shown) for back-side interconnection to a printed circuit board or other component mounting assembly as part of final device construction. Alternatively, the back side or top side of substrate 12 may be provided with contact pads or pins, which are left exposed following the molding process to permit electrical interconnection of the molded subassembly within another electrical system. A complete biometric sensor assembly with integrated visual indicator is thus obtained.

Figure 3:
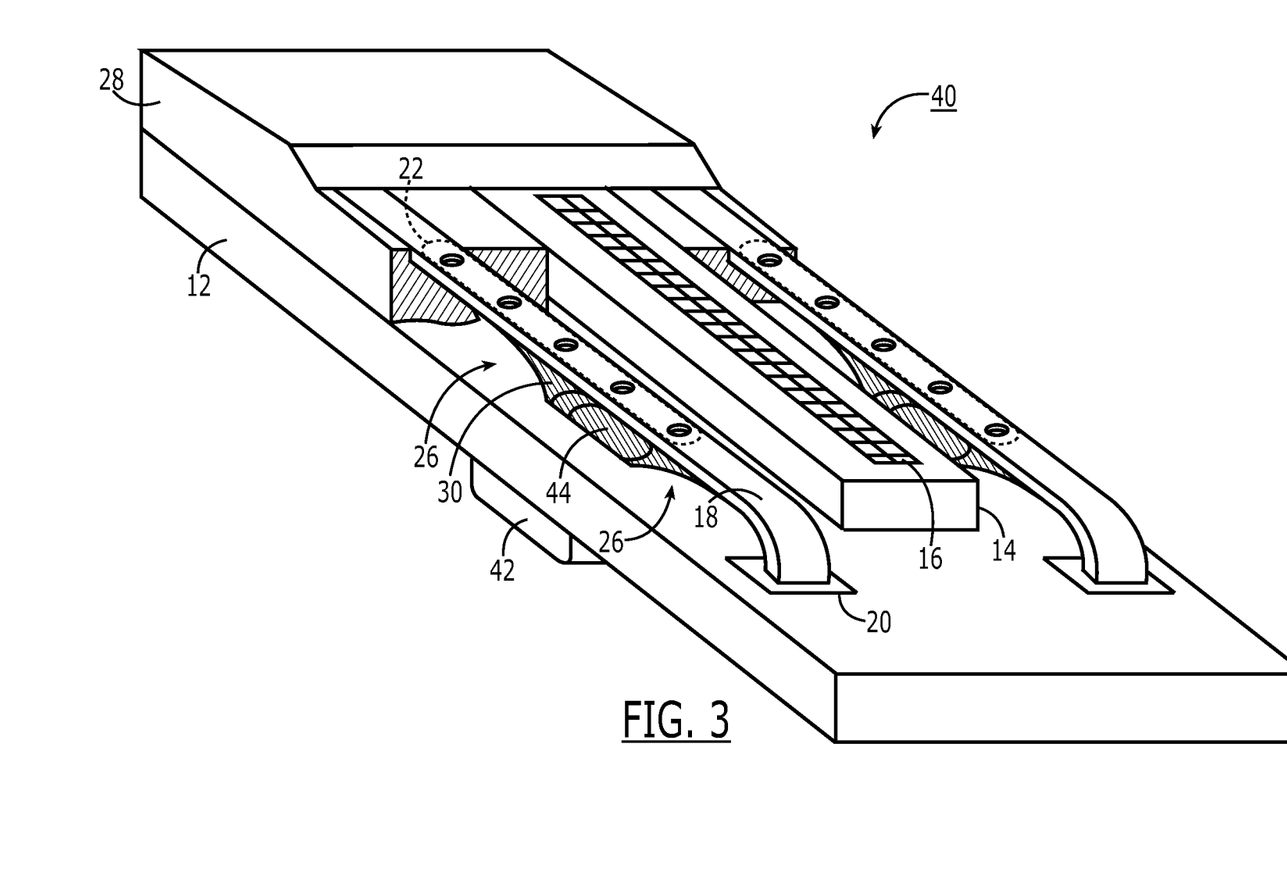
FIG. 3 is a partial cut-away perspective view of a biometric sensor assembly with integrated visual indicator according to a second embodiment of the present disclosure.
Figure 4:
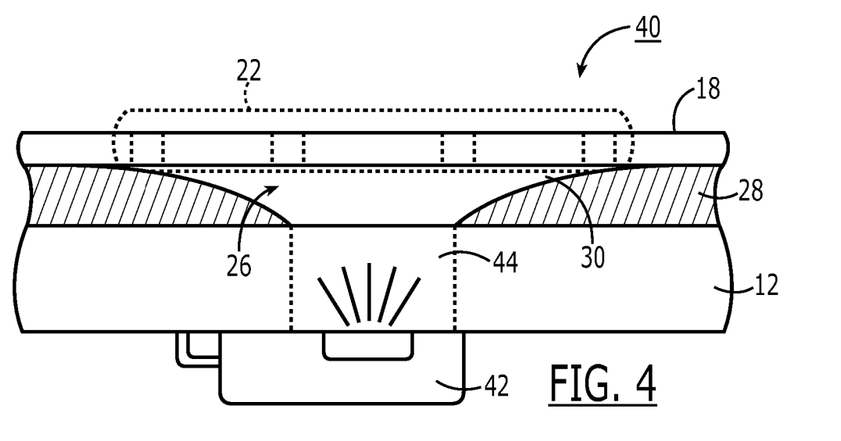
FIG. 4 is a side, or elevation view of the biometric sensor assembly with integrated visual indicator shown in FIG. 3.

According to the previous description, light source 24 was positioned on the top surface of substrate 12. That is, it was described as located on the same side as die 14 and bezels 18. However, according to another embodiment 40, a light source 42 may be positioned on the opposite side to die 14 and bezels 18—the back side of substrate 12, as shown in FIGS. 3 and 4. A via 44 is provided between the back and front sides of substrate 12, located generally below bezel 18. Light emitted from light source 42 travels through via 44 to light-directing region 26 and optical element 30, and ultimately through visual indicator region 22. Via 44 may be a hollow region or may be filled with an optically transparent material. While shown attached to the back side of substrate 12, light source 42 may alternatively be completely separate from, although proximate substrate 12, in which case light source 42 is positioned relative to substrate 12 such that light may pass through via 44 to light-directing region 26.

Figure 5A:
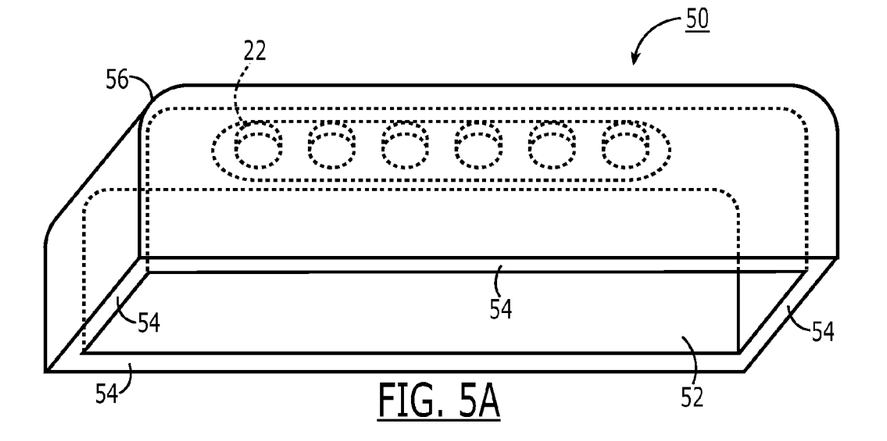
FIG. 5A is a perspective view of an embodiment of a bezel which establishes a light-directing region as a void defined by sidewalls and an upper surface (containing the visual indicator region) according to an embodiment of the present disclosure.
Figure 5B:
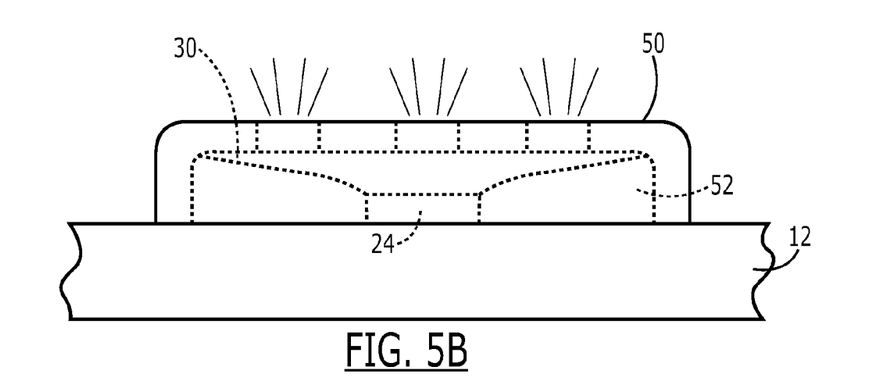
FIG. 5B is a side, or elevation, view of the bezel of FIG. 5A located on a substrate according to an embodiment of the present disclosure.
Figure 5C:
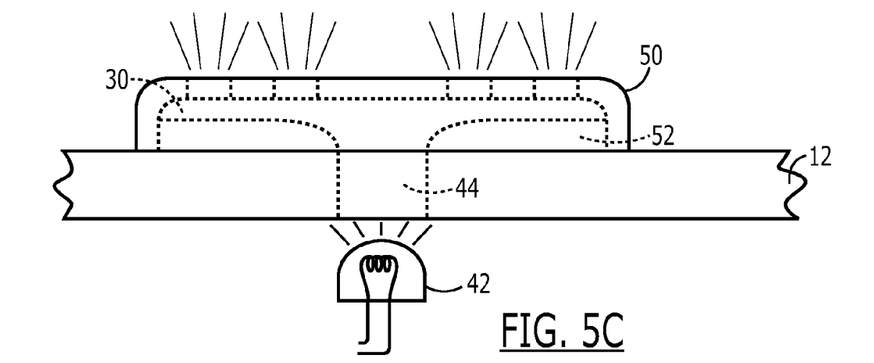
FIG. 5C is a side, or elevation, view of the bezel of FIG. 5A located on a substrate according to another embodiment of the present disclosure.

The description above of a biometric sensor included one or more bezels 18 which, as mounted to substrate 12, have an inverted "U"-shape when viewed from the side. The light-directing region 26 is generally formed in these embodiments by the optical elements 30 disposed therein. However, according to a variation of the above shown in FIGS. 5A, 5B, and 5C, a bezel 50 may be provided which establishes the light-directing region as a void 52 defined by sidewalls 54 and an upper surface 56 (containing the visual indicator region). Bezel 50 may be secured to substrate 12 either with a light source within void 52, as shown in FIG. 5B, or with void 52 disposed over via 44, as shown in FIG. 5C such that light may be transmitted into void 52 to indicator region 22, and further such that the encapsulation structure 28 is prevented from entering void 52 by a seal of sidewalls 54 to the front side of substrate 12. In addition, any of the aforementioned optical elements 30 may be formed in or disposed in void 52 to increase the optical efficiency of light transmission from light source to visual indictor region.

In addition, the above description has focused on an opaque, conductive bezel with indicia formed therein by material removal, such as etching. However, bezel 18 may be fabricated of a conductive transparent material, and the indicia may be applied to the bezel surface, for example by screening or application of pre-printed templates. Alternatively, the bezels may be molded, and the indicia formed in the bezel by way of the molding process itself. Still further, the bezel may be a hybrid of metal and transparent material, with the indicia formed in the transparent material by one of the above-described methods.

Figure 6A:
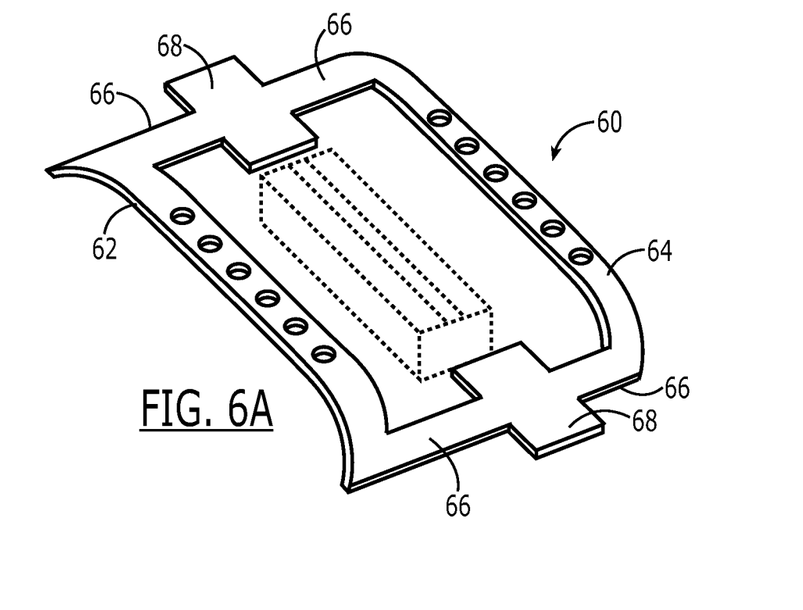
FIG. 6A is a perspective view and FIGS. 6B and 6C are side, or elevation, views of a bezel frame according to an embodiment of the present disclosure.
Figure 6B:
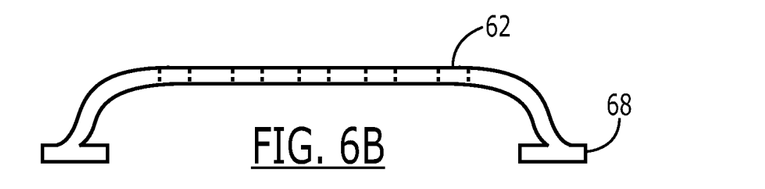
Figure 6C:
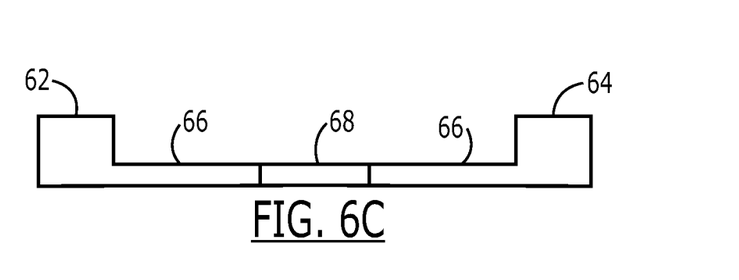

Still further, while the embodiment shown in FIG. 1 includes multiple bezels 18, each individually and discretely located on substrate 12, according to one variation of the disclosure herein, only a single bezel is employed. In addition, in the case of at least one bezel, the bezel(s) may form a portion of an integrated lead frame and bezel structure as described in co-pending application Ser. No. 12/324,869, which is incorporated herein by reference. Still further, two or more bezels may form a part of a bezel frame 60, such as that illustrated in FIGS. 6A, 6B, and 6C. Bezel frame 60 includes first bezel 62 and second bezel 64, with connecting arms 66 connecting bezels 62, 64 to contact and bonding pads 68.

Figure 7A:
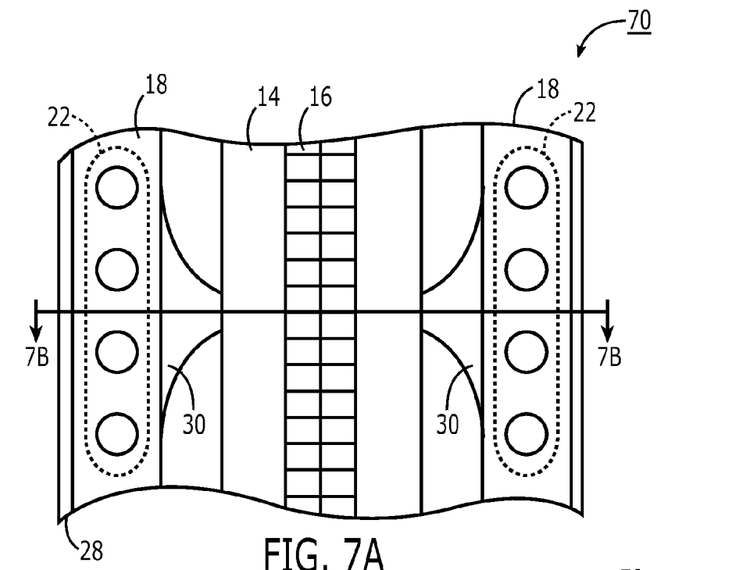
Figure 7B:
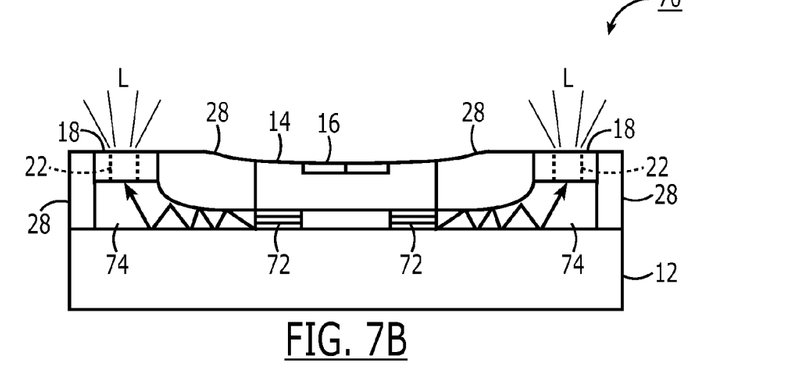
FIG. 7B is a side, or elevation, view of a biometric sensor assembly with integrated visual indicator and die including a die-formed light source according to another embodiment of the present disclosure.
Figure 8:
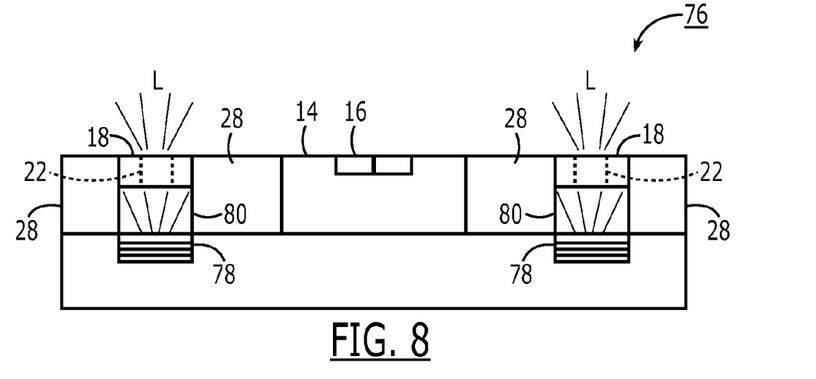
FIG. 8 is a side, or elevation, view of a biometric sensor assembly with integrated visual indicator and substrate-formed light source according to still another embodiment of the present disclosure.

According to the previous descriptions, the light source used for illuminating the visual indicator region may either be a discrete element mounted to the substrate at the top or bottom side thereof, or may be integrally located in the die or substrate. FIGS. 7A and 7B illustrate an embodiment 70 in which an edge-emitting light source 72, such as an LED, is formed on a lower surface of die 14. An optical element 74 directs light from light source 72 towards the visual indicator region 22 of bezel 18. FIG. 8 is a cut-away side, or elevation, view illustrating another embodiment 76 in which a light source 78, such as a VCSEL or LED die is wirebonded to the substrate 12. An optical element 80 directs light from light source 78 towards the visual indicator region 22 of bezel 18.

Figure 9A:
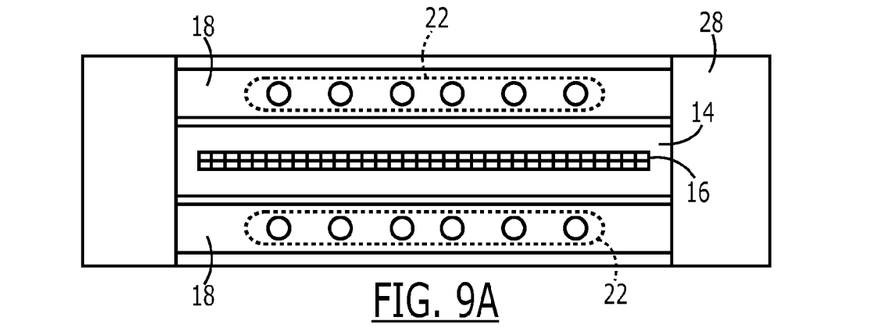
FIGS. 9A through 9C are top, or plan, views of various embodiments of a biometric sensing device with integrated visual indicator, showing various different indicia as visual indicators according to the present disclosure.
Figure 9B:
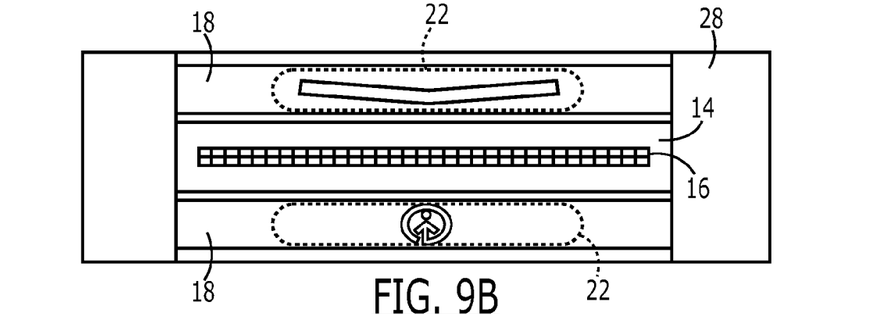
Figure 9C:
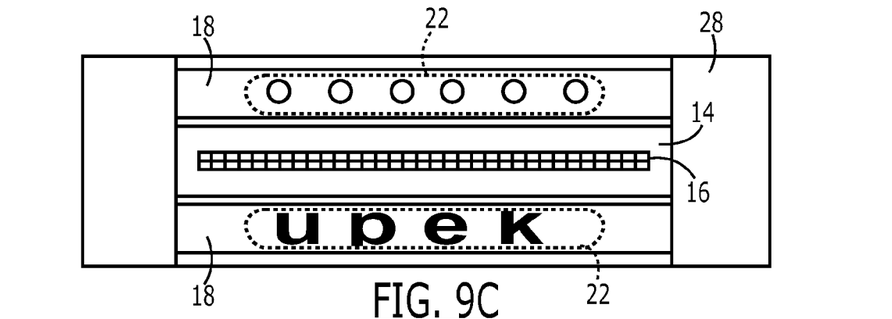

Additionally, it has been previously mentioned that the indicia within visual indicator region 22 may be symbols, patterns text, etc. FIGS. 9A, 9B, and 9C illustrate several different examples, and highlight that the indicia may be of virtually any type as warranted by the application of the present disclosure. While the specific indicia in no way limit the scope of the present disclosure, the present disclosure is unique in that a structure and method making that structure are provided which include indicia on a bezel located proximate sensor circuitry and within an encapsulation structure.

Physical and environmental protection of the structural elements of the assembly is provided by the encapsulation structure, while light transmission within that structure to the visual indicator regions is provided.

Finally, while the above has focused on an integrated packaging substrate which carries the die, bezel, light source, light directing region, and other elements, the present disclosure is equally applicable to an arrangement in which the packaging substrate carries certain elements, such as the die, bezel, and light directing region, while a secondary substrate, such as a printed circuit board, carries other components such as the light source. Several different embodiments of such an arrangement are shown in FIGS. 10A-10C.

Figure 10A:
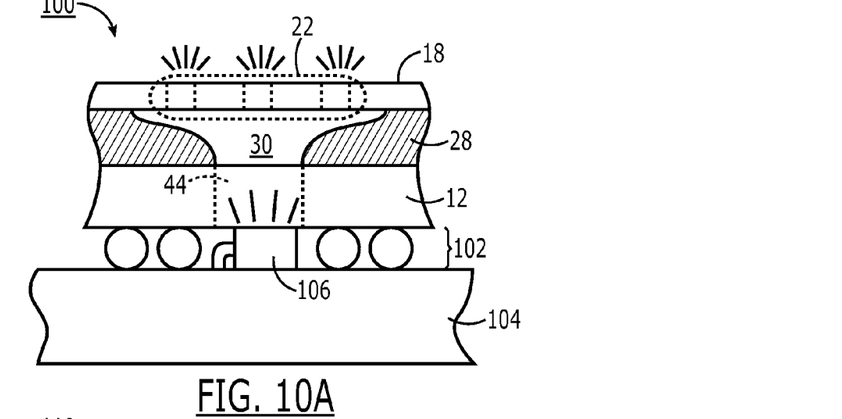
FIGS. 10A-10C show various embodiments according to the present disclosure in which a packaging substrate carries certain elements, such as a die, bezel, and light directing region, while a secondary substrate, such as a printed circuit board, carries other components such as a light source.

FIG. 10A shows an assembly 100 in which packaging substrate 12 is mounted by way of a ball grid array (BGA) 102 to a secondary substrate 104. In assembly 100, light source 106 is mounted on a top surface of substrate 104 and positioned such that light is emitted by light source 106 through optical via 44 to optical element 30 and ultimately though visual indicator region 22. In the embodiments of FIGS. 10A-10C light source 106 is effectively positioned away from a first or front side of substrate 12, and proximate a back or second side of substrate 12.

Figure 10B:
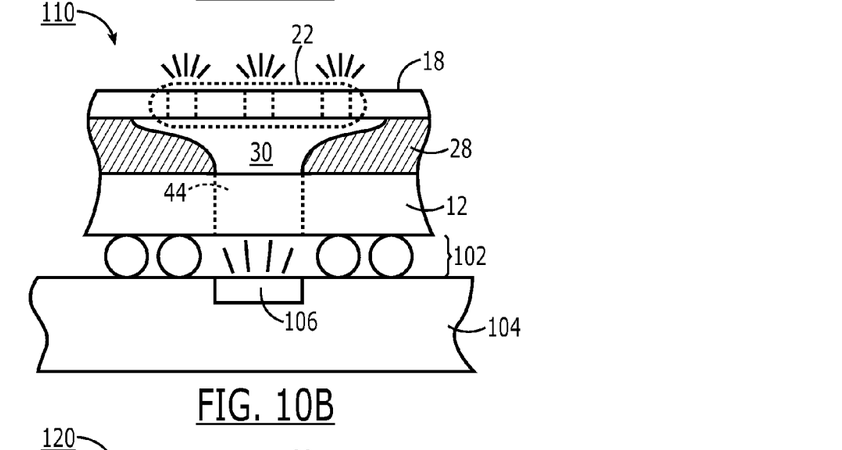

FIG. 10B shows an assembly 110 in which packaging substrate 12 is again mounted by way of a ball grid array (BGA) 102 to a secondary substrate 104. In assembly 110, light source 106 is mounted with and may be an integral part of substrate 104, and positioned such that light is emitted by light source 106 through optical via 44 to optical element 30 and ultimately though visual indicator region 22.

Figure 10C:
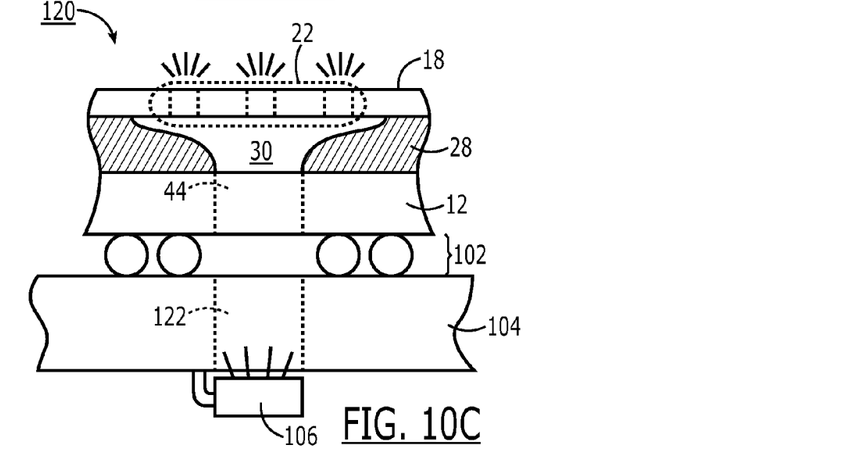

FIG. 10C shows an assembly 120 in which packaging substrate 12 is once again mounted by way of ball grid array (BGA) 102 to secondary substrate 104. In assembly 120, light source 106 is mounted to a back surface of substrate 104, and positioned such that light is emitted by light source 106 through an optical via 122 in secondary substrate 104. That light is then transmitted to optical via 44, to optical element 30, and ultimately though visual indicator region 22.

Given the physical reality that no two devices are absolutely identical, and that despite the most careful engineering and manufacturing methodologies variations from device to device will exist, no limitation in the description of the present disclosure or its claims can or should be read as absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

Furthermore, while a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. For example, the disclosure above has primarily been directed to a class of devices commonly referred to as fingerprint strip sensors, which capture a plurality of consecutive images of different portions of a moving fingerprint, then analyze and normalize those images in software to obtain a complete fingerprint image. However, the disclosure above is equally applicable to variety of other fingerprint sensor devices such as area sensors, which capture complete images of a stationary fingerprint, and indeed sensors for biometrics other than fingerprints, such as iris scanning, etc. Furthermore, various of the above-disclosed and other features and functions, or alternatives thereof, may be desirably combined into many other different systems or applications, such as laptop computers, mobile telephones, safes, facility access controls, etc. Still further, various presently unforeseen or unanticipated alternatives, modifications variations, or improvements therein or thereon may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. A biometric sensing device with integrated visual indicator, comprising:
 a substrate having a first side and a second side;
 a die having formed therein biometric sensing circuitry, said die secured to a die-receiving region of said first side of said substrate;
 a first conductive bezel having a visual indicator region, said first conductive bezel secured to a first bezel region of said first side of said substrate proximate said die-receiving region;
 a light source associated with said substrate;
 a first light-directing region optically coupled between said light source and said visual indicator region of said first conductive bezel; and
 an encapsulation material embedding therein said die, said first light-directing region, and said first conductive bezel such that said encapsulation material is between said die and said first conductive bezel, and such that said visual indicator region of said first conductive bezel and a top surface of said die are visibly exposed to a user.

2. The biometric sensing device of claim 1, wherein said first light-directing region includes a first optical element which preferentially directs light from said light source to said visual indicator region.

3. The biometric sensing device of claim 2, wherein said first optical element is selected from the group consisting of: optical lenses, fiber optic light guide, light pipes, and molded optically conductive compound.

4. The biometric sensing device of claim 2, wherein said first optical element is molded onto said first conductive bezel.

5. The biometric sensing device of claim 1, wherein said light source is located proximate said first side of said substrate.

6. The biometric sensing device of claim 1, wherein said substrate is provided with an optical via connecting said first and second sides of said substrate, and further wherein said light source is located proximate said second side of said substrate and light emitted therefrom may pass from said second side of said substrate through said optical via to said first side of said substrate and to said first light-directing region.

7. The biometric sensing device of claim 6, wherein said light source is electrically interconnected to said substrate.

8. The biometric sensing device of claim 1, wherein said light source defines a portion of said substrate such that light is emitted therefrom at said first side of said substrate.

9. The biometric sensing device of claim 1, wherein said light source is integrated with said die such that light may be emitted therefrom proximate said first side of said substrate.

10. The biometric sensing device of claim 1, wherein:
said first light directing region is a void defined by sidewalls of said first conductive bezel and said visual indicator region; and
said first conductive bezel is secured to said substrate such that said encapsulation material is prevented from entering said void.

11. The biometric sensing device of claim 10, wherein said light source is located within said void.

12. The biometric sensing device of claim 1, further comprising:
a second conductive bezel secured to a second bezel region of said first side of said substrate, said second conductive bezel having a visual indicator region, and said second conductive bezel being electrically interconnected to said die by way of said substrate; and
a second light-directing region optically coupled between said light source and said visual indicator region of said second conductive bezel;
wherein said encapsulation material further embeds therein said second conductive bezel, such that said visual indicator region of said second conductive bezel is visibly exposed to a user.

13. The biometric sensing device of claim 12, wherein said first conductive bezel and said second conductive bezel form portions of a bezel frame, and further wherein said bezel frame is physically coupled to said substrate and electrically coupled to said die by way of said substrate.

14. The biometric sensing device of claim 12, wherein said light source comprises first and second light emitting elements disposed such that said first light emitting element is optically coupled to said visual indicator region of said first conductive bezel by said first light-directing region, and said second light emitting element is optically coupled to said visual indicator region of said second conductive bezel by said second light-directing region.

15. The biometric sensing device of claim 12, wherein said visual indicator region of said first conductive bezel has a first visual appearance and said visual indicator region of said second conductive bezel has a second visual appearance, said first and said second visual appearances being different.

16. The biometric sensing device of claim 1, wherein said first conductive bezel is a conductive material having a pattern formed therein, the pattern forming said visual indicator region of said first conductive bezel.

17. The biometric sensing device of claim 16, wherein said conductive material is substantially opaque, and said pattern is formed as at least one opening extending entirely through a surface of said first conductive bezel.

18. The biometric sensing device of claim 16, wherein said conductive material is substantially opaque, and said pattern is formed through changes in thickness of a surface of said first conductive bezel.

19. The biometric sensing device of claim 18, wherein said changes in thickness are formed as recesses in the back side of said first conductive bezel opposite said visual indicator region.

20. The biometric sensing device of claim 1, wherein said first conductive bezel is formed of a translucent material.

21. The biometric sensing device of claim 1, wherein said light source is electrically interconnected to said die by way of said substrate.

22. The biometric sensing device of claim 1, wherein said first conductive bezel is electrically interconnected to said die by way of said substrate.

23. A biometric sensing device with integrated visual indicator, comprising:
a substrate having a first side and a second side;
a die secured to said first side of said substrate and including an array of biometric sensing elements;
a first conductive bezel including a visual indicator region and being secured to said first side of said substrate, said first conductive bezel being electrically interconnected to said die via said substrate;
a light source associated with said substrate;
a first light-directing region optically coupled between said light source and said visual indicator region of said first conductive bezel; and
an encapsulation material embedding therein said die, said first light-directing region, and said first conductive bezel such that said encapsulation material is between said die and said first conductive bezel, and such that said visual indicator region of said first conductive bezel and said array of biometric sensing elements are visibly exposed to a user.

24. The biometric sensing device of claim 23, wherein said first light-directing region includes a first optical element configured to direct light from said light source to said visual indicator region.

25. The biometric sensing device of claim 24, wherein said first optical element includes at least one of an optical lens, fiber optic light guide, light pipe and a molded optically conductive compound.

26. The biometric sensing device of claim 24, wherein said first optical element is molded onto said first conductive bezel.

27. The biometric sensing device of claim 23, further comprising:
a second conductive bezel secured to said first side of said substrate and including a visual indicator region, and said second conductive bezel being electrically interconnected to said die via said substrate; and
a second light-directing region optically coupled between said light source and said visual indicator region of said second conductive bezel;
wherein said encapsulation material further embeds therein said second conductive bezel, such that said visual indicator region of said second conductive bezel is also visibly exposed to the user.

28. The biometric sensing device of claim 27, wherein said first conductive bezel and said second conductive bezel define a bezel frame; and wherein said bezel frame is physically coupled to said substrate and electrically coupled to said die via said substrate.

29. The biometric sensing device of claim 27, wherein said light source comprises first and second light emitting elements positioned such that said first light emitting element is optically coupled to said visual indicator region of said first conductive bezel by said first light-directing region, and said second light emitting element is optically coupled to said visual indicator region of said second conductive bezel by said second light-directing region.

30. A method of making a biometric sensing device with integrated visual indicator, comprising:
securing a die to a first side of a substrate, the die including an array of biometric sensing elements;

securing a first conductive bezel including a visual indicator region to the first side of the substrate, and electrically interconnecting the first conductive bezel to the die via the substrate;

providing a light source associated with the substrate;

optically coupling a first light-directing region between the light source and the visual indicator region of the first conductive bezel; and embedding the die, the first light-directing region, and the first conductive bezel in an encapsulation material such that said encapsulation material is between said die and said first conductive bezel, and such that the visual indicator region of the first conductive bezel and the array of biometric sensing elements are visibly exposed to a user.

31. The method of claim 30, wherein the first light-directing region includes a first optical element configured to direct light from the light source to the visual indicator region.

32. The method of claim 31, wherein the first optical element includes at least one of an optical lens, fiber optic light guide, light pipe and a molded optically conductive compound.

33. The method of claim 31, wherein said first optical element is molded onto the first conductive bezel.

34. The method of claim 30, further comprising:

securing a second conductive bezel to the first side of the substrate and including a visual indicator region, and electrically interconnecting the second conductive bezel to the die via the substrate; and optically coupling a second light-directing region between the light source and the visual indicator region of the second conductive bezel;

wherein the encapsulation material further embeds therein the second conductive bezel, such that the visual indicator region of the second conductive bezel is also visibly exposed to the user.

35. The method of claim 34, wherein the first conductive bezel and the second conductive bezel define a bezel frame; and wherein the bezel frame is physically coupled to the substrate and electrically coupled to the die via the substrate.

36. The method of claim 34, wherein the light source comprises first and second light emitting elements positioned such that the first light emitting element is optically coupled to the visual indicator region of the first conductive bezel by the first light-directing region, and the second light emitting element is optically coupled to the visual indicator region of the second conductive bezel by the second light-directing region.

* * * * *